(12) United States Patent
Pakbaz et al.

(10) Patent No.: US 8,612,815 B2
(45) Date of Patent: Dec. 17, 2013

(54) ASYNCHRONOUS CIRCUIT WITH AN AT-SPEED BUILT-IN SELF-TEST (BIST) ARCHITECTURE

(75) Inventors: Faraydon Pakbaz, Milton, VT (US); Jack R. Smith, South Burlington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 13/327,847

(22) Filed: Dec. 16, 2011

(65) Prior Publication Data

US 2013/0159803 A1    Jun. 20, 2013

(51) Int. Cl.
    *G01R 31/28*    (2006.01)
(52) U.S. Cl.
    USPC .......................... 714/733; 714/738
(58) Field of Classification Search
    USPC ................... 714/733, 738
    See application file for complete search history.

(56) References Cited

U.S. PATENT DOCUMENTS

| | | | |
|---|---|---|---|
| 5,920,899 A * | 7/1999 | Chu ............... | 711/169 |
| 5,925,143 A | 7/1999 | Gillis et al. | |
| 6,590,424 B2 * | 7/2003 | Singh et al. ........... | 326/93 |
| 6,662,326 B1 * | 12/2003 | Schober ............. | 714/733 |
| 6,671,842 B1 | 12/2003 | Phan et al. | |
| 6,958,627 B2 * | 10/2005 | Singh et al. ........... | 326/93 |
| 7,085,982 B2 * | 8/2006 | Shinbo et al. ........ | 714/740 |
| 7,152,194 B2 | 12/2006 | Vinke et al. | |
| 7,266,738 B2 * | 9/2007 | Sato ............... | 714/718 |
| 7,283,404 B2 | 10/2007 | Khan et al. | |
| 7,343,535 B2 * | 3/2008 | Lai ................. | 714/724 |
| 7,430,698 B2 | 9/2008 | Flanagan et al. | |
| 7,444,559 B2 * | 10/2008 | Swanson et al. ........ | 714/718 |
| 7,711,513 B2 | 5/2010 | Sotiriou | |
| 7,751,266 B2 | 7/2010 | Adams et al. | |
| 7,797,591 B2 | 9/2010 | Hasegawa et al. | |
| 7,890,826 B2 * | 2/2011 | Parulkar et al. ........ | 714/731 |
| 7,930,601 B2 | 4/2011 | Eckelman et al. | |
| 8,188,765 B2 * | 5/2012 | Ouellette et al. ........ | 326/93 |
| 2002/0133754 A1 * | 9/2002 | Adams ............. | 714/42 |
| 2005/0039095 A1 | 2/2005 | Guettaf | |
| 2007/0204194 A1 | 8/2007 | Grise et al. | |

FOREIGN PATENT DOCUMENTS

EP    1168369 B1    2/2002

OTHER PUBLICATIONS

Ouellette et al., U.S. Appl. No. 12/882,425, filed Sep. 15, 2010.

\* cited by examiner

*Primary Examiner* — James C Kerveros
(74) *Attorney, Agent, or Firm* — Gibb & Riley, LLC; David A. Cain, Esq.

(57) ABSTRACT

Disclosed are integrated circuits that incorporate an asynchronous circuit with a built-in self-test (BIST) architecture using a handshaking protocol for at-speed testing to detect stuck-at faults. Specifically, a test pattern generator applies test patterns to an asynchronous circuit and an analyzer analyzes the output test data. The handshaking protocol is achieved through the use of a single pulse generator, which applies a single pulse to the test pattern generator to force switching of the test pattern request signal and, thereby to control application of the test patterns to the asynchronous circuit and subsequent switching of the test pattern acknowledge signal. Generation of this single pulse can in turn be forced by the switching of the test pattern acknowledge signal.

25 Claims, 6 Drawing Sheets

ASYNCHRONOUS CIRCUIT WITH AN AT-SPEED BUILT-IN SELF-TEST (BIST) ARCHITECTURE

BACKGROUND

1. Field of the Invention

The embodiments disclosed herein relate to circuits with built-in self-test architectures and, more particularly, to an asynchronous circuit with an at-speed built-in self-test (BIST) architecture.

2. Description of the Related Art

In data processing, a pipeline typically refers to an integrated circuit having multiple stages of logic blocks (i.e., multiple stages of combinational logic) that are connected in series so that the output of one stage (i.e., data-out) is the input of the next stage (i.e., data-in). A synchronous pipeline refers to a pipeline in which registers are inserted between the various stages and synchronously clocked to ensure that any data being transferred between stages is stable. That is, between each of the stages in a synchronous pipeline, a register is clocked so that the data-in to the logic block of a receiving stage is the final data-out from the logic block of the transmitting stage. An asynchronous pipeline refers to a pipeline that uses a handshaking protocol, rather clocked registers, to pass data from one stage to the next stage. That is, a transmitting stage performs its logic function (i.e., propagates data through its logic block) and also asserts a request signal to indicate to a receiving stage (i.e., the next stage in the pipeline) that new data is available for capture. Then, upon receipt of the request signal, the receiving stage captures this new data and asserts an acknowledge signal back to the transmitting stage to acknowledging receipt.

Asynchronous pipelines avoid a number of the problematic issues related to clocking (e.g., additional power requirements, management of clock skew, interfacing with environments clocked at different rates, etc.). However, today's methods of testing asynchronous pipelines or, for that matter, any other asynchronous circuits that rely on a handshaking protocol as opposed to synchronous clocking, require the circuit under test to be placed into a synchronous state in order to isolate timing faults (i.e., in order to isolate stuck-at and/or delay faults). Unfortunately, the cost, area and performance impacts associated with adding synchronous clocking to the circuit under test is relatively high, particularly in light of the fact that doing so inevitably changes the fail signature for the circuit under test and, thereby may mask a fail when the circuit is switched back to its asynchronous state.

SUMMARY

In view of the foregoing, disclosed herein are embodiments of an integrated circuit structure incorporating an asynchronous circuit with a built-in self-test (BIST) architecture using a handshaking protocol to allow for at-speed testing. As in conventional BIST architectures, the embodiments disclosed herein can comprise a test pattern generator for applying test patterns to the asynchronous circuit and an analyzer for analyzing the output test data. However, rather than adding hardware for synchronously clocking of the transmission of data from one component to the next, the embodiments can use a handshaking protocol.

Specifically, with this handshaking protocol, a transmitting component (e.g., the test pattern generator or asynchronous circuit) asserts a request signal to indicate that data (e.g., a test pattern or output test data, respectively) is either available for capture or not yet available for capture. A receiving component asserts an acknowledge signal to indicate that data has either been received or not yet been received. Implementation of such a handshaking protocol between the test pattern generator and the asynchronous circuit can be achieved through the use of a single pulse generator, which applies a single pulse to the test pattern generator to force switching of the test pattern request signal and, thereby to control application of the test patterns to the asynchronous circuit and subsequent switching of the test pattern acknowledge signal. Generation of this single pulse can in turn be forced by the switching of the test pattern acknowledge signal. Such a BIST architecture allows stuck-at faults to be detected. Optionally, additional components can be incorporated into the integrated circuit structure to apply a time constraint to the capture of output test data and, thereby to allow for at-speed testing to detect both stuck-at faults and delay faults.

More particularly, disclosed herein are embodiments of an integrated circuit structure. Each of the embodiments can comprise a test pattern generator, an asynchronous circuit, a single pulse generator and an analyzer.

Specifically, the test pattern generator can generate and output a test pattern request signal and a first test pattern. The asynchronous circuit can receive the test pattern request signal and the first test pattern. Furthermore, after receiving the test pattern request signal and the first test pattern, the asynchronous circuit can perform the following: (1) begin processing the first test pattern; (2) as the first test pattern is being processed, output a test pattern acknowledge signal; and (3) after the first test pattern is processed, output both an output test data request signal and output test data.

The single pulse generator can receive the test pattern acknowledge signal and, in response, can generate a single pulse. The test pattern generator can receive this single pulse and, in response, can perform the following: (1) switch the test pattern request signal from a first test pattern request signal value to a second test pattern request signal value so as to cause the asynchronous circuit to stop receiving the first test pattern; and (2) generate a second test pattern. It should be noted that the second test pattern will not be output until another single pulse is received, thereby switching the test pattern request signal back to the first test pattern request signal value (see the detail discussion section).

Additionally, the analyzer can be clocked by the output test data request signal and can receive both the output test data request signal and the output test data for processing. Specifically, the analyzer can delay the output test data request signal and, once delayed, can output it as an output test data acknowledge signal back to the asynchronous circuit. The analyzer can also analyze the output test data in order to detect faults. For example, the analyzer can compact the output test data into a test signature for comparison to an expected signature in order to detect faults.

With the basic integrated circuit structure configuration described above, the novel BIST architecture allows for at-speed testing to detect particularly stuck-at faults. Alternative configurations can incorporate additional components to allow for at-speed testing to detect both stuck-at faults and delay faults.

For example, the integrated circuit structure can further comprise a latch and an additional pulse generator, having a delay circuit. The latch can gate transmission of the output test data from the asynchronous circuit to the analyzer and the additional pulse generator can control opening and closing of this latch so that receipt of the output test data by the analyzer is subject to a time constraint. Specifically, the additional pulse generator can receive the test pattern request signal. In response, the additional pulse generator can output an enable signal with a first enable signal value to the latch so as to allow transmission of the output test data from the asynchronous circuit to the analyzer. However, a period of time after receiving the test pattern request signal (as determined by the delay circuit), the additional pulse generator can switch the enable signal from the first enable signal value to a second enable signal value so as to stop the transmission of the output test data from the asynchronous circuit to the analyzer. Optionally, the delay circuit can comprise a variable delay circuit so that the period of time and, thereby the time constraint can be selectively adjusted. In this case, the integrated circuit structure can also further comprise a controller that can adjust the period of time and, particularly, a state machine that can dynamically adjust the period of time for the delay and, thereby the time constraint for each test pattern, as appropriate.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, in data processing, a pipeline typically refers to an integrated circuit having multiple stages of logic blocks (i.e., multiple stages of combinational logic) that are connected in series so that the output of one stage (i.e., data-out) is the input of the next stage (i.e., data-in). A synchronous pipeline refers to a pipeline in which registers are inserted between the various stages and synchronously clocked to ensure that any data being transferred between stages is stable. That is, between each of the stages in a synchronous pipeline, a register is clocked so that the data-in to the logic block of a receiving stage is the final data-out from the logic block of the transmitting stage. An asynchronous pipeline refers to a pipeline that uses a handshaking protocol, rather clocked registers, to pass data from one stage to the next stage. That is, a transmitting stage performs its logic function (i.e., propagates data through its logic block) and also asserts a request signal to indicate to a receiving stage (i.e., the next stage in the pipeline) that new data is available for capture. Then, upon receipt of the request signal, the receiving stage captures this new data and asserts an acknowledge signal back to the transmitting stage to acknowledging receipt.

Asynchronous pipelines avoid a number of the problematic issues related to clocking (e.g., additional power requirements, management of clock skew, interfacing with environments clocked at different rates, etc.). However, today's methods of testing asynchronous pipelines or, for that matter, any other asynchronous circuits that rely on a handshaking protocol as opposed to synchronous clocking, require the circuit under test to be placed into a synchronous state in order to isolate timing faults (i.e., in order to isolate stuck-at and/or delay faults). Unfortunately, the cost, area and performance impacts associated with adding synchronous clocking to the circuit under test is relatively high, particularly in light of the fact that doing so inevitably changes the fail signature for the circuit under test and, thereby may mask a fail when the circuit is switched back to its asynchronous state.

In view of the foregoing, disclosed herein are embodiments of an integrated circuit structure incorporating an asynchronous circuit with a built-in self-test (BIST) architecture using a handshaking protocol to allow for at-speed testing. As in conventional BIST architectures, the embodiments disclosed herein can comprise a test pattern generator for applying test patterns to an asynchronous circuit and an analyzer analyzing the output test data. However, rather than adding hardware for synchronously clocking of the transmission of data from one component to the next, the embodiments can use a handshaking protocol.

Specifically, with this handshaking protocol, a transmitting component (e.g., the test pattern generator or asynchronous circuit) asserts a request signal to indicate that data (e.g., a test pattern or output test data, respectively) is either available for capture or not yet available for capture. A receiving component asserts an acknowledge signal to indicate that data has either been received or not yet been received. Implementation of such a handshaking protocol between the test pattern generator and the asynchronous circuit can be achieved through the use of a single pulse generator, which applies a single pulse to the test pattern generator to force switching of the test pattern request signal and, thereby to control application of the test patterns to the asynchronous circuit and subsequent switching of the test pattern acknowledge signal. Generation of this single pulse can in turn be forced by the switching of the test pattern acknowledge signal. Such a BIST architecture allows stuck-at faults to be detected. Optionally, additional components can be incorporated into the integrated circuit structure to apply a time constraint to the capture of output test data and, thereby to allow for at-speed testing to detect both stuck-at faults and delay faults.

Figure 1:
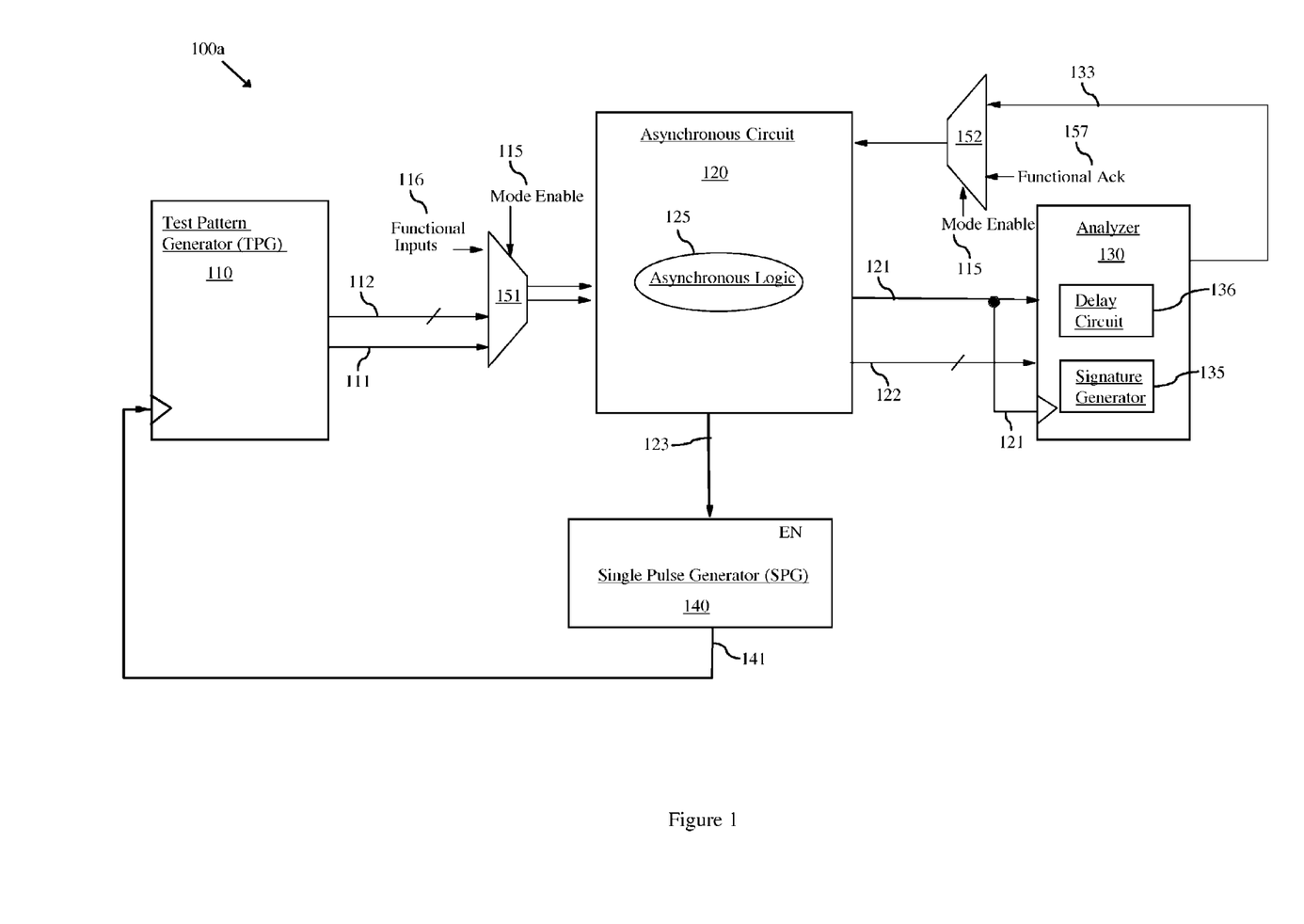
FIG. 1 is a schematic diagram illustrating an embodiment of an integrated circuit structure incorporating an asynchronous with a built-in self-test architecture using a handshaking protocol.
Figure 2:
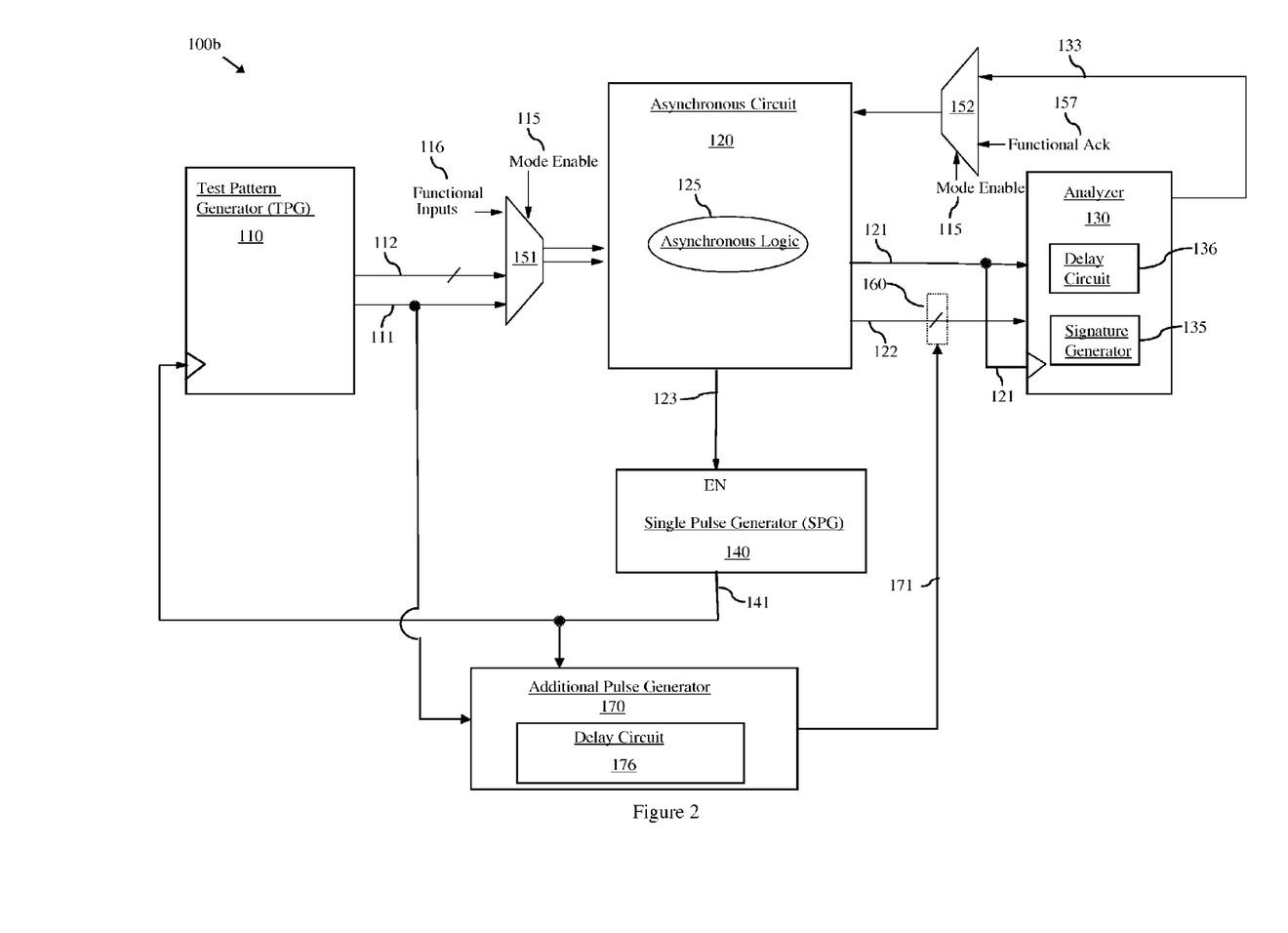
FIG. 2 is a schematic diagram illustrating another embodiment of an integrated circuit structure incorporating an asynchronous with a built-in self-test architecture using a handshaking protocol.
Figure 3:
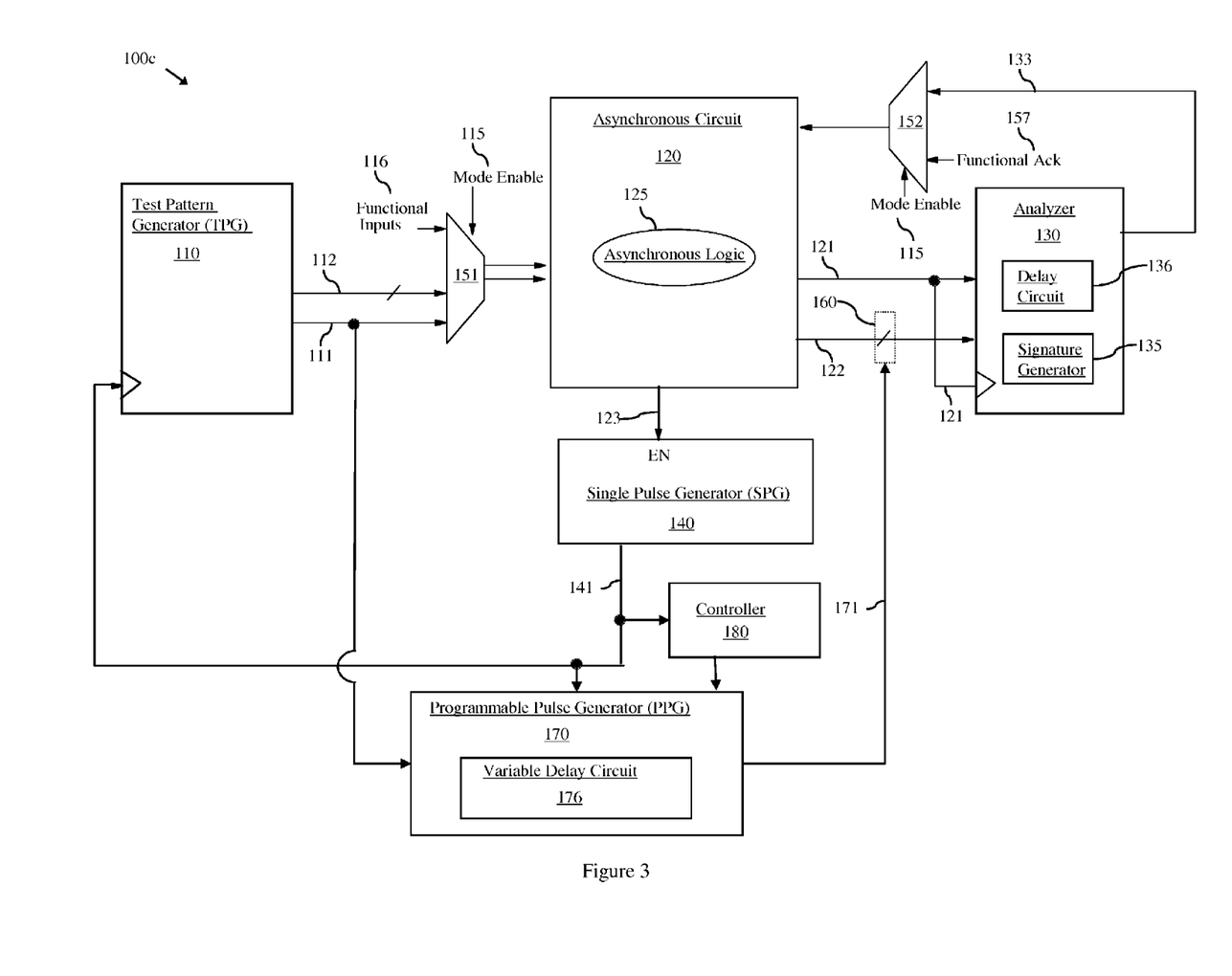
FIG. 3 is a schematic diagram illustrating yet another embodiment of an integrated circuit structure incorporating an asynchronous with a built-in self-test architecture using a handshaking protocol.

More particularly, referring to FIGS. 1, 2 and 3, disclosed herein are embodiments 100a, 100b, and 100c, respectively, of an integrated circuit structure incorporating an asynchronous circuit 120 with a built-in self-test (BIST) architecture using a handshaking protocol to allow for at-speed testing.

Each of these embodiments 100a-c of the integrated circuit structure can comprise at least an automatic test pattern generator (TPG) 110, an asynchronous circuit 120, a single pulse generator 140, and an analyzer 130.

The asynchronous circuit 120 can comprise any circuit under test that incorporates asynchronous logic 125, which is composed of combinational logic and unclocked storage elements (e.g., transparent latches). This asynchronous logic 125 uses the above-described handshaking protocol for data transmission. As a result of this handshaking protocol, the speed at which any data is processed by the asynchronous circuit 120 will be determined by actual delays within the asynchronous logic 125 and not by external clocking (i.e., not by clocked storage elements). The asynchronous circuit 120 can, for example, comprise an asynchronous pipeline circuit, such as a Muller pipeline circuit. Asynchronous pipeline circuits, such as Muller pipeline circuits, are well known in the art. Thus, the details of such circuits are omitted from this specification in order to allow the reader to focus on the salient aspects of the disclosed embodiments.

The test pattern generator (TPG) 110 can automatically generate and output (i.e., can be adapted to generate and output, configured to generate and output, programmed to generate and output, etc.) a series of different test patterns for transmission to the asynchronous circuit 120. Those skilled in the art will recognize that a test pattern generally refers to a set of input test sequences or input test data that, when subsequently applied to a circuit under test for processing, enable testers to distinguish between circuit behavior that is optimal or acceptable and circuit behavior that is indicative of design or manufacturing defects (see detailed discussion below of the process performed by the analyzer 130).

In each of the embodiments 100a-c disclosed herein, the TPG 110 can be designed specifically to generate different test patterns that test for stuck-at faults and, optionally, delay faults (see detailed discussion below specifically with regard to the embodiments 100b of FIG. 2 and 100c of FIG. 3). Those skilled in the art will recognize that a "stuck-at" fault refers to fault in which a signal is "stuck-at" a given high or low value. That is, regardless of the values of the input signals to a particular gate, the value of the output signal remains the same. Those skilled in the art will further recognize that a "delay fault" refers to a fault in which an output signal of a gate will eventually assume the correct high or low signal value, but will do so more slowly than expected. For purposes of this disclosure, a high signal value refers to a logical "1" and a low signal value refers to a logical "0". Such test pattern generators (TPGs) are well known in the art and, thus, the details thereof are omitted from this specification so as to allow the reader to focus on the salient aspects of the disclosed embodiments.

In addition to generating a test pattern, as described above, the test pattern generator (TPG) 110 disclosed herein is novel in that it can also generate and output (i.e., can be configured to generate and output, programmed to generate and output, etc.) a test pattern request signal 111, having either a high signal value or a low signal value. For purposes of illustration, the embodiments will be described as if a test pattern request signal with a high signal value indicates that a test pattern is ready for capture by the asynchronous circuit 120, whereas a test pattern request signal with a low signal value indicates that a test pattern is not yet ready for capture. However, it should be understood that, alternatively, a test pattern request signal with a low signal value could indicate that a test pattern is ready for capture by the asynchronous circuit 120, whereas a test pattern request signal with a high signal value could indicate that a test pattern is not yet ready for capture.

Figure 4:
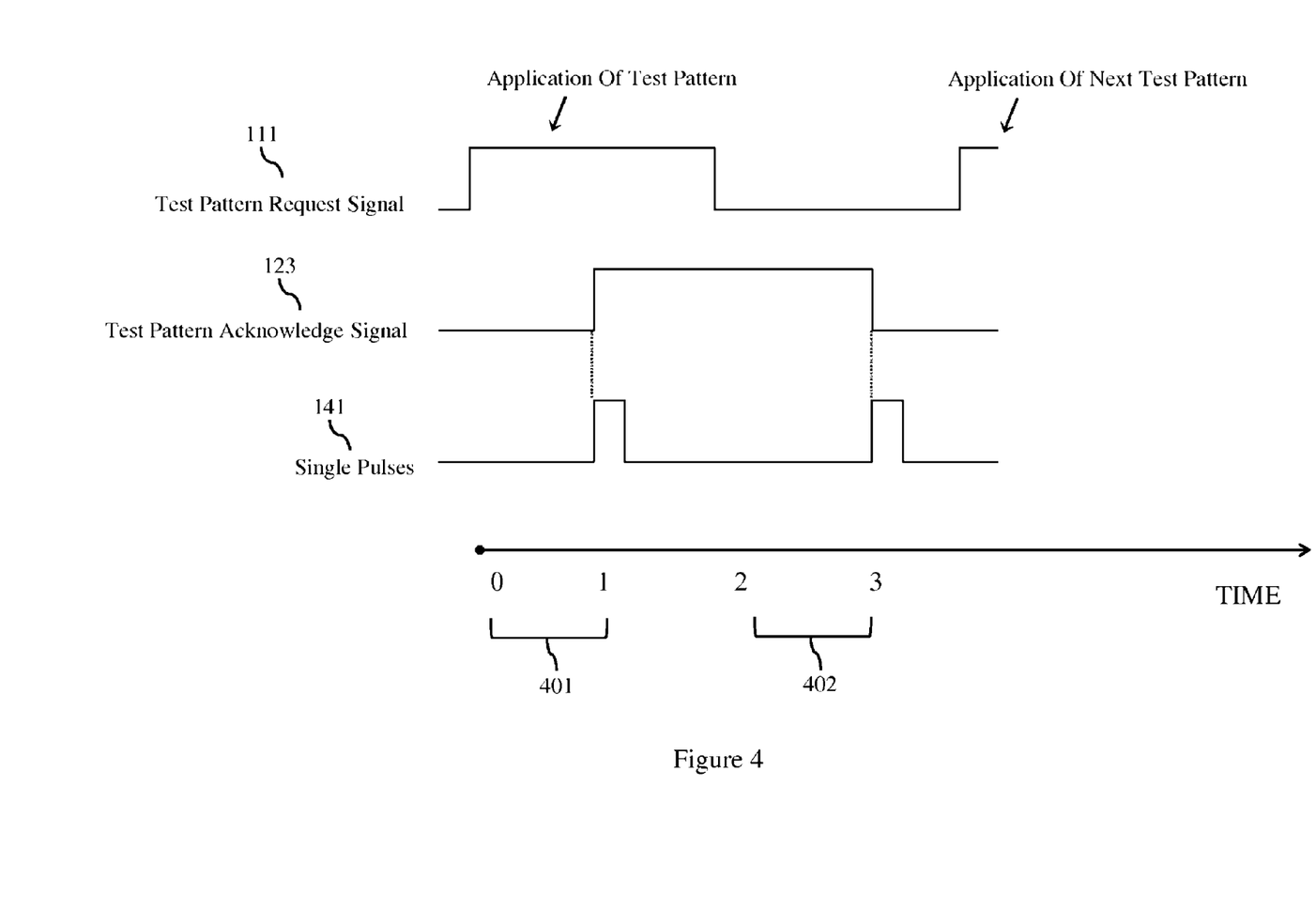
FIG. 4 is an exemplary timing diagram associated with the integrated circuit structure embodiments of FIGS. 1-3.

Thus, built-in self-testing can be initiated when a first test pattern 112 and a test pattern request signal 111 with a high signal value are generated and output by the test pattern generator 110. For example, referring to the signal timing diagram of FIG. 4 in combination with FIGS. 1-3, at time 0 when built-in self-testing is initiated, a test pattern request signal 111 generated and output by the test pattern generator 110 can transition to a high signal value, thereby indicating that a first test pattern 112 is ready for capture by the asynchronous circuit 120.

The asynchronous circuit 120 can receive the test pattern request signal 111 with the high signal value and can also receive the first test pattern 112 (e.g., via a multiplexor 151). More specifically, a multiplexer 151 can be electrically connected between the test pattern generator (TPG) 110 and the asynchronous circuit 120. The multiplexor 151 can operate in either a functional mode (i.e., a normal operating mode) or a test mode, as controlled by an external mode enable signal 115. In the functional mode, the multiplexer 151 can allow (i.e., can be adapted to allow, configured to allow, etc.) the transmission of functional inputs 116 to the asynchronous circuit 120 for functional (i.e., normal operational) processing. In the test mode, the multiplexer 151 can allow (i.e., can be adapted to allow, configured to allow, etc.) built-in self-testing to occur and can specifically allow a test pattern request signal 111 and test pattern 112 to be transmitted from the test pattern generator 110 to the asynchronous circuit 120.

Upon receipt of a test pattern request signal 111 with a high signal value, the asynchronous circuit 120 can begin to capture (i.e., receive) and process (i.e., propagate) the test pattern 112 through the asynchronous logic 125. See detail discussion below regarding the analysis process performed by the analyzer 130 after the test pattern 112 is processed by (i.e., propagated through) the logic 125 of the asynchronous circuit 120.

Additionally, some time period after the test pattern request signal 111 and the test pattern 112 are received by the asynchronous circuit 120 and after processing by the asynchronous logic 125 has begun but prior to completion, the asynchronous circuit 120 can generate and output (i.e., can be adapted to generate and output, can be configured to generator and output, etc.) a test pattern acknowledge signal 123 in order to indicate that the test pattern 112 was received. Since the asynchronous circuit 120 operates at its own speed (i.e., since it is not controlled by a clock), the delays associated with its output signals, including the output test pattern acknowledge signal 123, are based on the delay through the asynchronous logic 125. That is, the time period between when the test pattern request signal 111 and test pattern 112 are received and when the test pattern acknowledge signal 123 is output by the asynchronous circuit 120 is a function of the processing delay through the self-timed asynchronous logic 125 and the asynchronous circuit logic 125 can be adapted (i.e., can be designed, can be configured, etc.) to ensure that this time period is sufficient to ensure complete capture of the test pattern 112.

For purposes of illustration, the embodiments will be described as if a test pattern acknowledge signal with a high signal value indicates that a test pattern has been received and is being processed by the asynchronous circuit, whereas a test pattern acknowledge signal with a low signal value indicates that a test pattern has yet to be received. However, it should be understood that, alternatively, a test pattern acknowledge signal with a low signal value could indicate that a test pattern has been received and is being processed by the asynchronous circuit, whereas a test pattern acknowledge signal with a high signal value could indicate that a test pattern has yet to be received.

Therefore, at this stage, the test pattern request signal 111 with the high signal value is received by the asynchronous circuit 120 and in response the asynchronous circuit 120 outputs the test pattern acknowledge signal 123 to indicate that the test pattern 112 was captured. For example, again referring to the timing diagram of FIG. 4 in combination with FIGS. 1-3, at time 0 when built-in self-testing is initiated, the test pattern acknowledge signal 123 will have a low signal value because the first test pattern 112 has been received by the asynchronous circuit 120. However, at time 1 after the test pattern request signal 111 with the high signal value is received by the asynchronous circuit 120 and after a delay 401, the test pattern acknowledge signal 123 will transition from the low signal value to a high signal value.

It should be noted that in the embodiments 100a-c of the integrated circuit structure disclosed herein, rather than outputting the test pattern acknowledge signal 123 directly back to the test pattern generator 110, the test pattern acknowledge signal 123 can instead be output to the single pulse generator 140. The single pulse generator 140 can receive the test pattern acknowledge signal 123. Furthermore, in response to any change in the value of the test pattern acknowledge signal 123 (e.g., in response to a change from a low signal value to a high signal value or vice versa), the single pulse generator 140 can essentially immediately generate and output (i.e., can be adapted to essentially immediately generate and output, configured to essentially immediately generate and output, etc.) a single pulse 141. Each single pulse 141 can comprise a pulse that transitions from a low signal value to a high signal value and back in a relatively short period of time (e.g., in a single logic gate delay). For example, again referring to the timing diagram of FIG. 4 in combination with FIGS. 1-3, at time 0 when the built-in self-testing process is initiated, no pulses will be generated by the single pulse generator 140 because the test pattern acknowledge signal 123 has not changed in value. However, at time 1, when the test pattern acknowledge signal 123 transitions from a low signal value to a high signal value in response to a corresponding change in the test pattern request signal, the single pulse generator 140 will output a single pulse 141.

Figure 5:
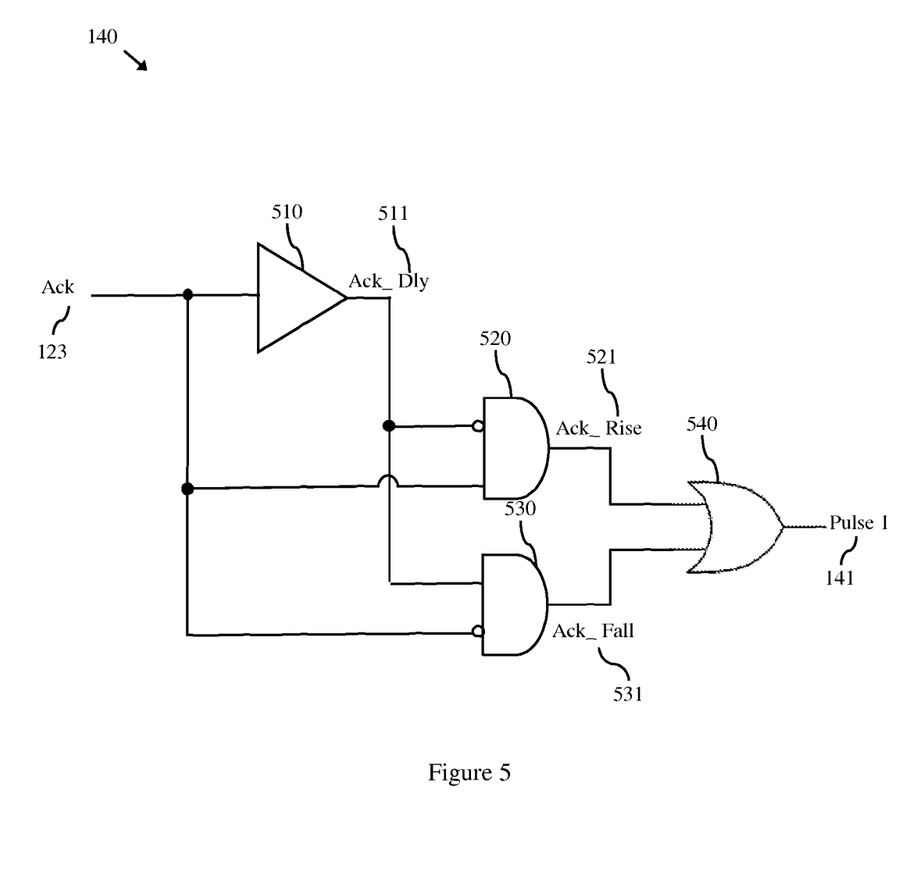
FIG. 5 is a schematic diagram illustrating an exemplary single pulse generator that can be incorporated into the integrated circuit structure embodiments of FIGS. 1-3.
Figure 6:
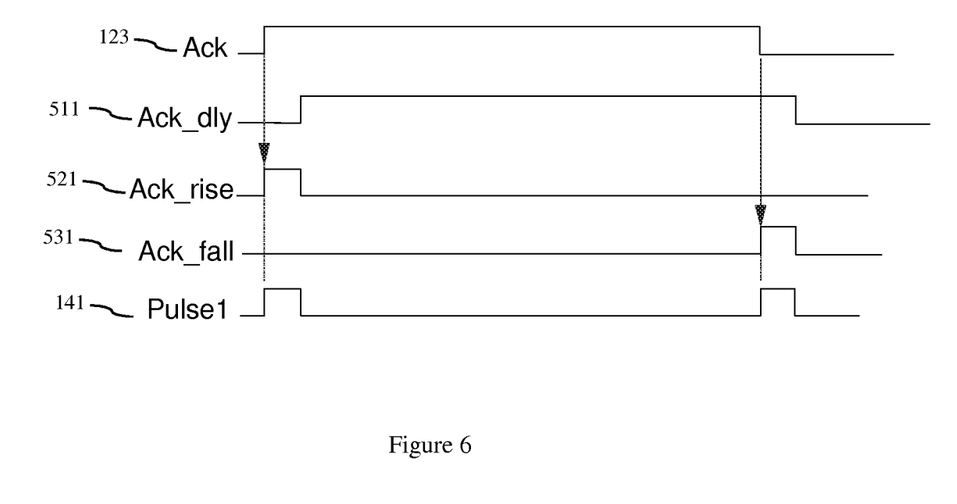
FIG. 6 is an exemplary timing diagram associated with the single pulse generator of FIG. 5.

FIG. 5 is a schematic diagram illustrating an exemplary single pulse generator 140 and FIG. 6 is a corresponding timing diagram. Specifically, referring to FIG. 5 in combination with the timing diagram of FIG. 6, an exemplary single pulse generator 140 can comprise an inverter 510, a first AND gate 520, a second AND gate 530 and an OR gate 540. The inverter 510 can receive and invert the test pattern acknowledge signal 123 to generate an inverted (delayed) test pattern acknowledge signal 511. Each of the AND gates 520 and 530 can receive both the test pattern acknowledge signal 123 and the inverted (delayed) test pattern acknowledge signal 511. The AND gates 520 and 530 can perform the same AND logic and output acknowledge rise and fall signals 521, 531, respectively. The acknowledge rise and fall signals 521, 531 can be received by the OR gate 540 which can perform the OR logic and output the single pulse 141. Configured in this manner, the acknowledge rise and fall signals 521, 531 from the AND gates 520, 530 will both remain low as long as the test pattern acknowledge signal 123 does not change values and, thus, the signal 141 output from the OR gate 540 will remain low. However, if the test pattern acknowledge signal switches in value, acknowledge rise and fall signals 521, 531 will go high for a single gate delay and for that amount of time the signal 141 will go high (i.e., the OR gate 540 will output a single pulse). It should be noted that the single pulse generator of FIG. 5 is only one exemplary single pulse generator that could be incorporated into the integrated circuit structure embodiments disclosed herein. Other single pulse generators, which are capable of generating a single pulse each time a signal changes value, are well known in the art and could, alternatively, be used.

In any case, each single pulse 141 generated and output by the single pulse generator 140 can be received by the test pattern generator 110 and, in response, the test pattern generator 110 can switch (i.e., can be adapted to switch, configured to switch, programmed to switch, etc.) the value of the test pattern request signal 111. At this point in the testing process, a single pulse 141 will cause the test pattern generator 110 to perform the following: (1) switch the test pattern request signal 111 from the high signal value back to a low signal value (i.e., from a first test pattern request signal value to a second test pattern request signal value) in order to cause the asynchronous circuit 120 to stop receiving (i.e., to stop capturing) the first test pattern 112; and (2) generate, but not yet output, a second test pattern. For example, again referring to the timing diagram of FIG. 4 in combination with FIGS. 1-3, at time 2, after a single pulse 141 is generated by the single pulse generator 140 and received by the test pattern generator 110, the test pattern generator 110 will switch the test pattern request signal 111 from the high signal value to a low signal value. The test pattern request signal 111 with the now low signal value is in turn received by the asynchronous circuit 120 (via the multiplexer 151) and is an indication to the asynchronous circuit 120 that the test pattern 112 is no longer valid. The single pulse 141 is also an indication to the test pattern generator 110 that a second test pattern can be generated for subsequent application to the asynchronous circuit 120 when ready.

Some time after the asynchronous circuit 120 receives the test pattern request signal 111 with the low signal value, the asynchronous circuit 120 can stop capturing (i.e., stop receiving) the first test pattern 112 and can further switch (i.e., can be adapted to switch, configured to switch, etc.) the test pattern acknowledge signal 123 from the high signal value back to a low signal value (i.e., from a first test pattern acknowledge signal value to a second test pattern acknowledge signal value). As mentioned above, since the asynchronous circuit 120 operates at its own speed (i.e., since it is not controlled by a clock), the delays associated with its output signals, including the output test pattern acknowledge signal 123, are based on the delay through the asynchronous logic 125. That is, the time period between when the test pattern request signal 111 switches values and when the test pattern acknowledge signal 123 is output by the asynchronous circuit 120 switches values is a function of the processing delay through the self-timed asynchronous logic 125. For example, again referring to the timing diagram of FIG. 4 in combination with FIGS. 1-3, at time period 3 after the test pattern request signal 111 with the low signal value is received by the asynchronous circuit 120 and after a delay 402, the test pattern acknowledge signal 123 will transition from the high signal value to a low signal value.

Again, rather than outputting the test pattern acknowledge signal 123 directly back to the test pattern generator 110, in the embodiments 100a-c disclosed herein the test pattern acknowledge signal 123 with the now low signal value is instead output to the single pulse generator 140. At this point in the testing process, the single pulse generator 140 can receive the test pattern acknowledge signal 123 with the low signal value and, in response to the change in value of the test pattern acknowledge signal 123 from the high signal value back to the low signal value, can essentially immediately generate and output (i.e., can be adapted to essentially immediately generate and output, configured to essentially immediately generate and output, etc.) an additional single pulse 141 (see FIGS. 5 and 6 and detailed discussed above with regard single pulse generation). For example, again referring to the timing diagram of FIG. 4 in combination with FIGS. 1-3, at time 3, when the test pattern acknowledge signal 123 transitions from a high signal value back to a low signal value, the single pulse generator 140 will output an additional single pulse 141.

This additional single pulse 141 can be received by the test pattern generator 110 and, in response, the test pattern generator 110 can perform the following: (1) switch the value of the test pattern request signal 111 from a low signal value back to a high signal value (i.e., from the second test pattern request signal value back to the first test pattern request signal value), thereby indicating to the asynchronous circuit 120 that the second test pattern 112 is ready for capture; and (2) output the second test pattern. That is, at this point in the testing process, the test pattern request signal 111 will switch high, which in turn will result in the output of the second test pattern for capture and processing by asynchronous circuit 120.

Consequently, the single pulse generator 140 clocks the test pattern generator 110 as a function of the speed of the asynchronous circuit 120 and, particularly, the speed of the asynchronous logic 125, thereby allowing for the implementation of the handshaking protocol between the test pattern generator 110 and asynchronous circuit 120 for at-speed testing.

Additionally, as mentioned above, after the asynchronous circuit 120 receives the first test pattern 112 and a test pattern request signal 111 having a high signal value, the asynchronous circuit 120 not only generates a test pattern acknowledge signal 123 with a high signal value (as discussed in detail above), but also processes the first test pattern 112 through the asynchronous logic 125 and outputs, to the analyzer 130, both output test data 122 and an output test data request signal 121 indicating that the output test data 122 is ready for capture. For purposes of illustration, the embodiments will be described as if an output test data request signal with a high signal value indicates that output test data is ready for capture by the analyzer, whereas an output test data request signal with a low signal value indicates that output test data is not yet ready for capture. However, it should be understood that, alternatively, an output test data request signal with a low signal value could indicate that output test data is ready for capture, whereas an output test data request signal with a high signal value could indicate that output test data is not yet ready for capture.

The analyzer 130 can receive (i.e., can be adapted to received, configured to receive, etc.) the output test data request signal 121 as an input and can further be clocked (i.e., can be adapted to be clocked, configured to be clocked, etc.) by that same output test data request signal 121. In response, the analyzer 130 can capture (i.e., can be adapted to capture, configured to capture, etc.) the output test data 122.

After receiving of the output test data request signal 121 and the output test data 122, the analyzer 130 can begin processing the output test data 122 for comparison to expected data. Specifically, the analyzer 130 can comprise an output response analyzer (ORA). This ORA 130 can comprise, for example, a signature generator 135 that compacts (i.e., is adapted to compact, configured to compact, programmed to compact, etc.) the output test data 122 into a test signature for comparison to an expected signature in order to detect a fail. Such signature generators are well known in the art. Thus, the details are omitted from this specification in order to allow the reader to focus on the salient aspects of the invention.

In addition, after the output data request signal 121 with the high signal value and the output test data 122 are received by the analyzer 130 and after processing by the analyzer 130 has begun but prior to completion, the analyzer 130 can generate and output (i.e., can be adapted to generate and output, can be configured to generator and output, etc.) an output data acknowledge signal 133. For purposes of illustration, the embodiments will be described as if an output test data acknowledge signal with a high signal value indicates that output test data has been received and is being processed by the analyzer, whereas an output test data acknowledge signal with a low signal value indicates that output test data has yet to be received. However, it should be understood that, alternatively, an output test data acknowledge signal with a low signal value could indicate that output test data has been received and is being processed by the analyzer, whereas an output test data acknowledge signal with a high signal value could indicate that output test data is has yet to be received.

The output test data acknowledge signal 133 can be transmitted back to the asynchronous circuit 120 (via a multiplexer 152) in order to indicate that the output test data 122 has been received and is being processed. More specifically, a multiplexer 152 can be electrically connected between the analyzer 130 and the asynchronous circuit 120. The multiplexor 152 can operate in either a functional mode (i.e., a normal operating mode) or a test mode, as controlled by an external mode enable signal 115. In the functional mode, the multiplexer 152 can allow (i.e., can be adapted to allow, configured to allow, etc.) the transmission of a functional acknowledge signal 157 to the asynchronous circuit 120 for functional (i.e., normal operational) processing. In the test mode, the multiplexer 152 can allow (i.e., can be adapted to allow, configured to allow, etc.) the test pattern acknowledge signal 133 to be transmitted from the analyzer 130 to the asynchronous circuit 120.

In one embodiment, the output test data acknowledge signal 133 can comprise a delayed version of the output test data request signal 121. That is, the analyzer 130 can further comprise a delay circuit 136 that receives and delays (i.e., that is adapted to receive and delay, is configured to receive and delay, etc.) the output test data request signal 121. The delay circuit 136 can further output (i.e., can be adapted to output, configured to output, etc.) the delayed test data request signal as the output test data acknowledge signal 133. This delay circuit 136 can specifically be configured to ensure that the delay between when the output test data request signal 121 is received by the analyzer 130 and when the output test data acknowledge signal 133 is output by the analyzer 130 is for a predetermined period of time sufficient to ensure that capture of the output test data 122 by the analyzer 130 is complete before the asynchronous circuit 120 switches the value of the output data request signal 121 and stops data capture.

With the basic integrated circuit structure configuration described above and shown in the embodiment 100a of FIG. 1, the novel BIST architecture allows for at-speed testing to detect stuck-at fails. That is, the analyzer 130 can analyze the output test data 122, as described above, in order to detect when a signal propagated through the asynchronous logic 125 is stuck-at a given high or low value, regardless of the test pattern applied. However, the embodiment 100a of FIG. 1 does not allow delay faults to be detected. Specifically, in the embodiment 100a of FIG. 1, the output test data 122 is captured and analyzed by the analyzer 130 without being subject to any timing constraints. Consequently, signals that are output from the asynchronous circuit 120 and that eventually assume the correct high or low signal value even if they don't immediately do so are not detected as faults (i.e., delay faults).

In view of the foregoing, alternative configurations for the integrated circuit structure shown in the embodiments 100b and 100c of FIGS. 2 and 3, respectively, are also disclosed to allow for at-speed testing to detect both stuck-at and delay faults in the asynchronous circuit 120. Specifically, the embodiments 100b and 100c of FIGS. 2 and 3 further incorporate additional components to apply a time constraint to the transmission of the output test data 122 from the asynchronous circuit 120 to the analyzer 130 and, thereby to allow for at-speed testing to detect both stuck-at faults and delay faults.

For example, the embodiments 100b and 100c of FIGS. 2 and 3 can each further comprise a latch 160 and an additional pulse generator 170, having a delay circuit 176. The latch 160 (e.g., a transparent latch) can gate transmission of the output test data 122 from the asynchronous circuit 120 to the analyzer 130 and the additional pulse generator 170 can control opening and closing of this latch 160 so that receipt of the output test data 122 by the analyzer 130 is subject to a time constraint. Specifically, the additional pulse generator 170 can receive the test pattern request signal 111 (e.g., when built-in self-testing is initiated and the first test pattern 112 is applied to the asynchronous circuit 120). In response, the additional pulse generator 170 can output an enable signal 171 with a first enable signal value (e.g., a high signal value) to the latch 160 so as to allow transmission of the resulting output test data 122 from the asynchronous circuit 120 to the analyzer 130. However, a period of time after receiving the test pattern request signal 111 (as determined by the delay circuit 176), the additional pulse generator 170 can switch the enable signal 171 from the first enable signal value to a second enable signal value (e.g., from the high signal value to a low signal value) so as to stop the transmission of the output test data 122 from the asynchronous circuit 120 to the analyzer 130. Consequently, in embodiments 100b and 100c of FIGS. 2 and 3, data signals that are output from the asynchronous circuit 120 and that do not assume the correct high or low signal value by the period of time established for the time constraint will be detected by the analyzer 130 as faults (i.e., delay faults).

Referring specifically to the embodiment 100c of FIG. 3, the delay circuit 176 within the pulse generator 170 can optionally comprise a variable delay circuit so that the period of time and, thereby the time constraint established to detect delay faults can be selectively adjusted. Pulse generators having variable delay circuits, also referred to as programmable pulse generators or tau pulse generators, are well known in the art. Thus, the details of such programmable pulse generators are omitted form this specification so as to allow the reader to focus on the salient aspects of this embodiment. In this case, the integrated circuit structure 100c can also further comprise a controller 180 that is in communication with the programmable pulse generator 170 and that can adjust the period of time for the delay (e.g., on demand, dynamically, etc.).

For example, the controller 180 can comprise state machine that is clocked by the single pulses 141 from the single pulse generator 140 and that dynamically (i.e., automatically and selectively) adjusts the period of time for the delay and, thereby the time constraint for capturing output test data, 122 as appropriate. More specifically, the normal propagation times for different test patterns through the asynchronous logic 125 will vary due to the patterns themselves as well as the configuration of the logic. A controller 180 and, particularly, a state machine can be in communication with the programmable pulse generator 170, can be clocked by pulses 141 from the single pulse generator 140 and can be programmed to automatically and selectively adjust the period of time between when the test pattern request signal 111 is received and when the enable signal 171 is switch from high to low to stop transmission of the output test data 122 based on the normal propagation time associated with the particular test pattern being applied. Consequently, in the embodiment 100c of FIG. 3, signals that are output from the asynchronous logic 125 and that do not assume the correct high or low signal value by the selected period of time established for the time constraint for the particular test pattern as applied to the particular logic cone (inside the asynchronous logic 125) will be detected by the analyzer 130 as faults (i.e., delay faults). Thus, in this embodiment 100c greater delay fault detection sensitivity is achieved as compared to the embodiment 100b of FIG. 2.

It should be understood that the terminology used herein is for the purpose of describing particular embodiments only and is not intended to be limiting. For example, as used herein, the singular forms "a", "an" and "the" are intended to include the plural forms as well, unless the context clearly indicates otherwise. Furthermore, the terms "comprises", "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof. It should also be understood that the corresponding structures, materials, acts, and equivalents of all means or step plus function elements in the claims below are intended to include any structure, material, or act for performing the function in combination with other claimed elements as specifically claimed. Finally, many modifications and variations to the disclosed embodiments will be apparent to those of ordinary skill in the art without departing from the scope and spirit of the disclosed embodiments.

Therefore, disclosed above are embodiments of an integrated circuit structure incorporating an asynchronous circuit with a built-in self-test (BIST) architecture using a handshaking protocol to allow for at-speed testing. The integrated circuit structure can specifically comprise a test pattern generator for applying test patterns to an asynchronous circuit and an analyzer analyzing the output test data. Implementation of the handshaking protocol between the test pattern generator and the asynchronous circuit can be achieved through the use of a single pulse generator, which applies a single pulse to the test pattern generator to force switching of the test pattern request signal and, thereby to control application of the test patterns to the asynchronous circuit and subsequent switching of the test pattern acknowledge signal. Generation of this single pulse can in turn be forced by the switching of the test pattern acknowledge signal. Such a BIST architecture allows stuck-at faults to be detected. Optionally, additional components can be incorporated into the integrated circuit structure to apply a time constraint to the capture of output test data and, thereby to allow for at-speed testing to detect both stuck-at faults and delay faults.

What is claimed is:
1. An integrated circuit structure comprising:
  a test pattern generator generating and outputting a test pattern request signal and a first test pattern;
  an asynchronous circuit receiving said test pattern request signal and said first test pattern and, after said receiving of said test pattern request signal and said first test pattern, outputting a test pattern acknowledge signal; and
  a single pulse generator receiving said test pattern acknowledge signal and, in response to said receiving of said test pattern acknowledge signal, generating a single pulse,
  said test pattern generator further receiving said single pulse and, in response to said receiving of said single pulse, said test pattern generator performing the following:
    switching said test pattern request signal from a first test pattern request signal value to a second test pattern request signal value to cause said asynchronous circuit to stop receiving said first test pattern; and
    generating a second test pattern, said first test pattern and said second test pattern being different test patterns generated to test for faults in said asynchronous circuit.

2. The integrated circuit structure of claim 1,
said asynchronous circuit further switching said test pattern acknowledge signal from a first test pattern acknowledge signal value to a second test pattern acknowledge signal value after said switching of said test pattern request signal from said first test pattern request signal value to said second test pattern request signal value, and
said single pulse generator further outputting an additional single pulse in response to said switching of said test pattern acknowledge signal from said first test pattern acknowledge signal value to said second test pattern acknowledge signal value.

3. The integrated circuit structure of claim 2, said test pattern generator further receiving said additional single pulse and, in response to said receiving of said additional single pulse, switching said test pattern request signal back to said first test pattern request signal value to cause said test pattern generator to output said second test pattern.

4. The integrated circuit structure of claim 1, said asynchronous circuit further ensuring that there is a delay between when said test pattern request signal is received and when said test pattern acknowledge signal is output.

5. The integrated circuit structure of claim 1,
said asynchronous circuit further processing said first test pattern and outputting an output test data request signal and output test data, and
said integrated circuit structure further comprising an analyzer clocked by said output test data request signal and performing the following:
receiving said output test data request signal and said output test data; and
after said receiving of said output test data request signal and said output test data, outputting an output test data acknowledge signal and compacting said output test data into a test signature for comparison to an expected signature to detect at least stuck-at faults.

6. The integrated circuit structure of claim 5, said analyzer further ensuring that there is a delay between when said output test data request signal is received and when said output test data acknowledge signal is output.

7. The integrated circuit structure of claim 1, said asynchronous circuit comprising an asynchronous pipeline comprising a multiple stages of logic blocks connected in series such that data-out from one stage is data-in for a next stage, said asynchronous pipeline using a handshaking protocol for data transmission between said stages.

8. An integrated circuit structure comprising:
a test pattern generator generating and outputting a test pattern request signal and a first test pattern;
an asynchronous circuit receiving said test pattern request signal and said first test pattern and, after said receiving of said test pattern request signal and said first test pattern, performing the following:
processing said first test pattern;
during said processing, outputting a test pattern acknowledge signal; and
after said processing outputting an output test data request signal and output test data;
a single pulse generator receiving said test pattern acknowledge signal and, in response to said receiving of said test pattern acknowledge signal, outputting a single pulse,
said test pattern generator further receiving said single pulse and, in response to said receiving of said single pulse, said test pattern generator performing the following:
switching said test pattern request signal from a first test pattern request signal value to a second test pattern request signal value to cause said asynchronous circuit to stop receiving said first test pattern; and
generating a second test pattern, said first test pattern and said second test pattern being different test patterns generated to test for faults in said asynchronous circuit;
an analyzer receiving said output test data request signal and said output test data; and
a latch gating transmission of said output test data from said asynchronous circuit to said analyzer so as to allow receipt of said output test data by said analyzer to be subject to a time constraint.

9. The integrated circuit structure of claim 8, further comprising an additional pulse generator with a delay circuit, said additional pulse generator performing the following:
receiving said test pattern request signal;
in response to said receiving of said test pattern request signal, outputting an enable signal with a first enable signal value to said latch so as to allow said transmission of said output test data from said asynchronous circuit to said analyzer; and
a period of time after said receiving of said test pattern request signal, switching said enable signal to a second enable signal value so as to stop said transmission of said output test data from said asynchronous circuit to said analyzer.

10. The integrated circuit structure of claim 8,
said asynchronous circuit further switching said test pattern acknowledge signal from a first test pattern acknowledge signal value to a second test pattern acknowledge signal value after said switching of said test pattern request signal from said first test pattern request signal value to said second test pattern request signal value, and
said single pulse generator further outputting an additional single pulse in response to said switching of said test pattern acknowledge signal from said first test pattern acknowledge signal value to said second test pattern acknowledge signal value.

11. The integrated circuit structure of claim 10, said test pattern generator further receiving said additional single pulse and, in response to said receiving of said additional single pulse, switching said test pattern request signal back to said first test pattern request signal value to cause said test pattern generator to output said second test pattern.

12. The integrated circuit structure of claim 8, said asynchronous circuit further ensuring that there is a delay between when said test pattern request signal is received and when said test pattern acknowledge signal is output.

13. The integrated circuit structure of claim 8, said analyzer being clocked by said output test data request signal and, after said receiving of said output test data request signal and said output test data, outputting an output test data acknowledge signal and compacting said output test data into a test signature for comparison to an expected signature in order to detect stuck-at faults and delay faults.

14. The integrated circuit structure of claim 13, said analyzer further ensuring that there is a delay between when said output test data request signal is received and when said output test data acknowledge signal is output.

15. The integrated circuit structure of claim 8, said asynchronous circuit comprising an asynchronous pipeline.

16. An integrated circuit structure comprising:
a test pattern generator generating and outputting a test pattern request signal and a first test pattern;

an asynchronous circuit receiving said test pattern request signal and said first test pattern and, after said receiving of said test pattern request signal and said first test pattern, performing the following:
processing said first test pattern;
during said processing, outputting a test pattern acknowledge signal; and
after said processing outputting an output test data request signal and output test data;
a single pulse generator receiving said test pattern acknowledge signal and, in response to said receiving of said test pattern acknowledge signal, outputting a single pulse,
said test pattern generator further receiving said single pulse and, in response to said receiving of said single pulse, said test pattern generator performing the following:
switching said test pattern request signal from a first test pattern request signal value to a second test pattern request signal value to cause said asynchronous circuit to stop receiving said first test pattern; and,
generating a second test pattern, said first test pattern and said second test pattern being different test patterns generated to test for faults in said asynchronous circuit;
an analyzer receiving said output test data request signal and said output test data;
a latch gating transmission of said output test data from said asynchronous circuit to said analyzer so as to allow receipt of said output test data by said analyzer to be subject to a time constraint; and
an additional pulse generator with a programmable delay circuit, said additional pulse generator performing the following:
receiving said test pattern request signal;
in response to said receiving of said test pattern request signal, outputting an enable signal with a first enable signal value to said latch so as to allow said transmission of said output test data from said asynchronous circuit to said analyzer; and
a period of time after said receiving of said test pattern request signal, switching said enable signal to a second enable signal value so as to stop said transmission of said output test data from said asynchronous circuit to said analyzer, said period of time being selectively adjustable.

17. The integrated circuit structure of claim 16,
said asynchronous circuit further switching said test pattern acknowledge signal from a first test pattern acknowledge signal value to a second test pattern acknowledge signal value after said switching of said test pattern request signal from said first test pattern request signal value to said second test pattern request signal value, and
said single pulse generator further outputting an additional single pulse in response to said switching of said test pattern acknowledge signal from said first test pattern acknowledge signal value to said second test pattern acknowledge signal value.

18. The integrated circuit structure of claim 17, said test pattern generator further receiving said additional single pulse and, in response to said receiving of said additional single pulse, switching said test pattern request signal back to said first test pattern request signal value to cause said test pattern generator to output said second test pattern.

19. The integrated circuit structure of claim 16, said asynchronous circuit further ensuring that there is a delay between when said test pattern request signal is received and when said test pattern acknowledge signal is output.

20. The integrated circuit structure of claim 16, said analyzer being clocked by said output test data request signal and, after said receiving of said output test data request signal and said output test data, outputting an output test data acknowledge signal and compacting said output test data into a test signature for comparison to an expected signature in order to detect stuck-at faults and delay faults.

21. The integrated circuit structure of claim 20, said analyzer further ensuring that there is a delay between when said output test data request signal is received and when said output test data acknowledge signal is output.

22. The integrated circuit structure of claim 16, said asynchronous circuit comprising an asynchronous pipeline.

23. An integrated circuit structure comprising:
a test pattern generator generating and outputting a test pattern request signal and a first test pattern;
an asynchronous circuit receiving said test pattern request signal and said first test pattern and, after said receiving of said test pattern request signal and said first test pattern, performing the following:
processing said first test pattern;
during said processing, outputting a test pattern acknowledge signal; and
after said processing outputting an output test data request signal and output test data;
a single pulse generator receiving said test pattern acknowledge signal and, in response to said receiving of said test pattern acknowledge signal, outputting a single pulse,
said test pattern generator further receiving said single pulse and, in response to said receiving of said single pulse, said test pattern generator performing the following:
switching said test pattern request signal from a first test pattern request signal value to a second test pattern request signal value to cause said asynchronous circuit to stop receiving said first test pattern; and,
generating a second test pattern, said first test pattern and said second test pattern being different test patterns generated to test for faults in said asynchronous circuit;
an analyzer receiving said output test data request signal and said output test data;
a latch gating transmission of said output test data from said asynchronous circuit to said analyzer so as to allow receipt of said output test data by said analyzer to subject to a time constraint;
an additional pulse generator with a programmable delay circuit, said additional pulse generator performing the following:
receiving said test pattern request signal;
in response to said receiving of said test pattern request signal, outputting an enable signal with a first enable signal value to said latch so as to allow said transmission of said output test data from said asynchronous circuit to said analyzer; and
a period of time after said receiving of said test pattern request signal, switching said enable signal to a second enable signal value so as to stop said transmission of said output test data from said asynchronous circuit to said analyzer; and
a controller adjusting said period of time and, thereby said time constraint.

24. The integrated circuit structure of claim 23, said controller comprising a state machine dynamically adjusting said period of time and, thereby said time constraint for each test pattern.

25. The integrated circuit structure of claim 23,
said asynchronous circuit further switching said test pattern acknowledge signal from a first test pattern acknowledge signal value to a second test pattern acknowledge signal value after said switching of said test pattern request signal from said first test pattern request signal value to said second test pattern request signal value, and
said single pulse generator further outputting an additional single pulse in response to said switching of said test pattern acknowledge signal from said first test pattern acknowledge signal value to said second test pattern acknowledge signal value.

\* \* \* \* \*